United States Patent [19]

Summers

[11] Patent Number: 4,503,547

[45] Date of Patent: Mar. 5, 1985

[54] ELECTRICAL DATA PULSE PROCESSING

[75] Inventor: Christopher P. Summers, London, England

[73] Assignee: U.S. Philips Corporation, New York, N.Y.

[21] Appl. No.: 441,697

[22] Filed: Nov. 15, 1982

[30] Foreign Application Priority Data

Dec. 4, 1981 [GB] United Kingdom ............... 8136613

[51] Int. Cl.³ .............................................. H04N 5/14
[52] U.S. Cl. ....................................... 375/76; 358/37; 358/166; 375/98; 375/99
[58] Field of Search ............... 375/76, 98, 99; 358/32, 358/36, 37, 39, 164, 166, 167, 177; 328/127, 162, 163

[56] References Cited

U.S. PATENT DOCUMENTS 4,030,121 6/1977 Faroudja ............................... 358/37
4,386,369 5/1983 Shanley et al. ...................... 358/166
4,437,124 3/1984 Cochran .............................. 358/166

Primary Examiner—Benedict V. Safourek
Attorney, Agent, or Firm—Thomas A. Briody; William J. Streeter; Edward W. Goodman

[57] ABSTRACT

A circuit arrangement for improving the shape of a data pulse waveform prior to data slicing by correcting a reduction of the high frequency content of the waveform using an adaptive crispening technique. The arrangement includes a high-pass filter (1) connected to an input (8) at which the waveform is applied. The filter (1) separates the high frequency content which is multiplied by an amplitude correcting signal in a multiplier (2). The data pulse waveform signal and the multiplier output are added in an adder (6) to produce a resultant output waveform, which is fed to a data slicer (10). The resultant output waveform is also applied to a peak-to-peak detector (3) via a switch (7) when the latter is closed periodically by a timing circuit (5). The detector (3) produces a control signal proportional to the amplitude of the resultant output waveform which it receives via the switch (7). A subtractor (4) produces the amplitude correcting signal as the difference between the control signal and a reference signal (RF).

6 Claims, 11 Drawing Figures

ELECTRICAL DATA PULSE PROCESSING

BACKGROUND OF THE INVENTION

This invention relates to electrical data pulse processing and, more particularly, to a circuit arrangement for improving the shape of a data pulse waveform which has suffered distortion during transmission.

It is well-known that when transmitting pulses which are nominally "square-wave", the available bandwidth of the transmission medium can so attenuate the high frequency components of such pulses that their pulse waveform, as received, tends to become rounded with sloping flanks. In other words, the original pulses to be transmitted contain high frequency components which are outside the available bandwidth of the transmission medium.

It is also well-known that both the leading and trailing flank slopes of a received pulse waveform can be increased, or steepened, by a technique known as "crispening" in which, in its basic form, an auxiliary waveform, obtained by a differentiation of a pulse waveform is added to the received pulse waveform to produce a resultant received pulse waveform having steeper flank slopes than the original received pulse waveform, albeit at the expense of unwanted overshoots which are introduced into the flank slopes.

United Kingdom patent specification No. 706 341 describes arrangements for "crispening" the instant pulse waveform of a television video signal. In a particular one of the arrangements which is described in this prior patent specification, the auxiliary waveform obtained by a differentiation of the instant pulse waveform is not added directly to that waveform, but instead the auxiliary waveform is clipped by a peak separator to produce upper and lower portions of the auxiliary waveform, and it is only these upper and lower portions which are added to the instant pulse waveform. The effect of adding only these upper and lower portions is to reduce the overshoots which are introduced into the flank slopes of the instant waveform, compared with the overshoots which would have been introduced had the entire auxiliary waveform been added to the instant pulse waveform. The clipping level for producing the upper and lower portions of the auxiliary waveform can be adjusted so as to vary the absolute amplitude of these portions.

In the publication Radio Mentor, March 1971, at pages 142–143, there is described a further arrangement which is for "crispening" a television video signal waveform and which can be considered as a refinement of the particular "crispening" arrangement discussed above. In this further arrangement, an auxiliary waveform obtained by a differentiation of the instant pulse waveform is clipped and then a second differentiation is performed on the clipped auxiliary waveform to obtain a resultant auxiliary waveform which is added to the instant pulse waveform to produce a resultant video signal waveform. The clippping level at which the auxiliary waveform is clipped is dynamically controlled. This dynamic control aims at reducing the overshoots introduced into the flank slopes of the resultant video signal waveform for a given increase in steepness.

SUMMARY OF THE INVENTION

It is an object of the present invention to provide a circuit arrangement which can perform an improved "crispening" technique which incorporates an adaptive control which avoids the need for either a clipping process or a second differentiation process.

By avoiding the need either to clip, or to differentiate, a second time, the auxiliary waveform, this improved "crispening" technique will afford the advantage of simplicity in the implementation of a circuit arrangement which performs it, compared with the last-mentioned "crispening" technique discussed above, while still retaining an improvement of the basic form of "crispening" technique.

The present invention is concerned with improving the shape of a received data pulse waveform which is composed of data pulses that occur in a serial bit stream and are arranged in successive bursts of which each comprises a sequence of clock run-in pulses followed by a sequence of code pulses. Such a data pulse waveform is, for instance, used in Teletext data transmission. (See "Broadcast Teletext Specification", September 1976, published jointly by the British Broadcasting Corporation, Independent Broadcasting Authority and British Radio Equipment Manufacturer's Association).

The satisfactory reception of such a data pulse waveform poses numerous problems, not the least of which is to restore the received waveform approximately to its original (transmitted) shape, when the received waveform has suffered distortion due to the deleterious effect of a close positive echo during transmission, or of a receiver mis-tuning. The effect of each of these forms of distortion is to cause a substantial reduction in the amplitude of the high frequency components in the data pulse waveform in the same way that bandwidth limitation does. Each of these forms of distortion also has the further effect of tending to "spread", non-linearly, the individual pulses of the data pulse waveform beyond their respective bit periods, so that a pulse in one bit period can spread to an adjacent bit period to create an erroneous pulse level.

As will be described, the pulse shaping performed by a circuit arrangement according to the invention tends to restore such pulses to their respective bit periods, because the "crispening" which occurs effectively alters the mean position as well as the slope of the leading and trailing flanks of a data pulse waveform.

According to the invention there is provided a circuit arrangement for improving the shape of a data pulse waveform which is composed of data pulses that occur in a serial bit stream and are arranged in successive bursts of which each comprises a sequence of clock run-in pulses followed by a sequence of code pulses; which circuit arrangement comprises a high-pass filter connected to receive said data pulse waveform and operable as a differentiator to separate high frequency components of that waveform from the remainder thereof, these separated high frequency components forming an auxiliary waveform, and a combining circuit connected to receive said data pulse waveform and said auxiliary waveform and operable to produce a resultant pulse waveform; and which circuit arrangement is characterized by further comprising control means connected to receive the resultant pulse waveform and operable to produce an amplitude correcting signal which, for each data pulse burst, is adjusted to a value which is a function of the mean peak-to-peak amplitude of the sequence of clock run-in pulses in the data pulse burst, and gain control means responsive to said amplitude correcting signal to determine the amplitude of said auxiliary waveform for the following sequence of code pulses in the data pulse burst.

In carrying out the invention, said control means may comprise reference means for producing a reference signal, a switch to which said resultant pulse waveform is applied, a timing circuit which is operable to close said switch for the duration of the sequence of clock run-in pulses in each data pulse burst, a peak-to-peak detector which is connected to the switch output and includes capacitor means for storing the mean peak-to-peak value of the sequence of clock run-in pulses, the charge on the capacitor means providing a control signal, and a difference circuit connected to receive said reference signal and said control signal and responsive thereto to produce a difference signal which constitutes said amplitude correcting signal.

Such a specific implementation of a circuit arrangement according to the invention has the advantage that even when the control signal is substantially zero, there is a well-defined difference signal which determines the value of the amplitude correcting signal. The difference signal will be at a maximum value when the control signal is zero (being determined solely by the reference signal), and will decrease in value as the value of the control signal increases to reduce the value of the amplitude correcting signal. Without a reference signal to compare the control signal with, the amplitude correcting signal would have to rely directly on the subsisting value of the control signal for its value.

The invention has a particular but non-exclusive application in television receiver apparatus in or for use in a television system of a character in which coded data pulses, pertaining to alpha-numeric text or other message information, are transmitted in a video signal in television lines where no picture signals pertaining to normal picture information are present. At present, it is envisaged that such transmission would be only in field-blanking intervals, but the possibility does exist for so-called "full-field" transmission in which all the television lines of a field are used for transmitting coded data pulses: in other words an entire television channel is dedicated to the data transmission. Examples of a television system of the above character are the CEE-FAX and ORACLE systems used by the BBC and IBA, respectively, for transmitting Teletext data within the broadcast standards of the 625-line domestic television system as employed in the United Kingdom. (See the aforementioned "Broadcast Teletext Specification").

Television receiver apparatus for a television system of the above character is known from Mullard Technical Publication M81-0001, dated June 1981. A conventional television receiver for the system includes, or has associated with it, such television receiver apparatus which includes a data acquisition circuit to extract the coded data pulses from a received video signal. In the implementation of a practical form of such a data acquisition circuit, a difficulty that arises is to obtain a data pulse waveform which is sufficiently undistorted as to be suitable for subsequent data slicing to regenerate the coded data pulses. One reason for this difficulty is the aforesaid deleterious effect on the data pulse waveform of a close positive echo or of receiver mis-tuning. The present invention can thus serve to at least partially correct, prior to data slicing, the distortion suffered by the data pulse waveform.

DESCRIPTION OF THE DRAWINGS

In order that the invention may be more fully understood, reference will now be made by way of example to the accompanying drawings, of which:

FIGS. 1(a), 1(b) and 1(c) show explanatory diagrams relating to the data pulse coding and transmission of alpha-numeric text or other message information in a television system of the character referred to;

DESCRIPTION OF THE PREFERRED EMBODIMENT

Figure 1A:
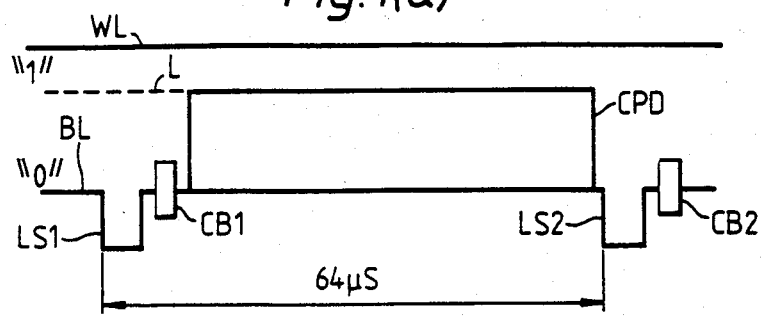

Referring to the drawings, FIG. 1(a) shows a waveform diagram which represents a Teletext television video signal for one television line which occurs in a field-blanking interval and which includes coded pulse data. In this waveform diagram the line synchronizing pulse for the television line concerned is represented at LS1, and the line synchronizing pulse for the next television line is represented at LS2. The color burst on the television line concerned and that on the next television line, are represented at CB1 and CB2, respectively. Assuming the television broadcast standards for 625-line systems as employed in the United Kingdom, the period of one television line (i.e. the period between the leading edges of successive line synchronizing pulses) is 64 μs., as indicated. Such a television line is referred to as a television data line and can contain coded data pulses representing 360 binary bits which may be considered as 45 eight-bit bytes. The position of the coded pulse data in the data line is indicated at CPD. The binary bit signalling rate is approximately 7Mbits/s, and the binary bit signalling levels are defined between a black level BL and a peak white level WL. The binary '0' level is the level BL and the binary '1' level is the level L.

Figure 1B:
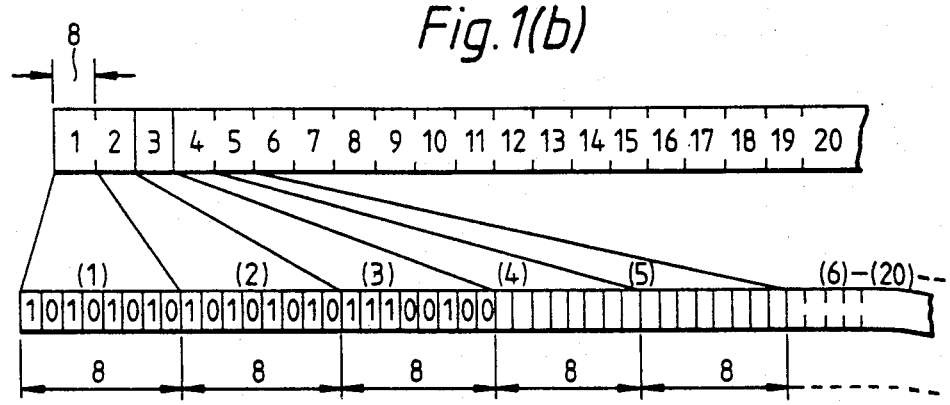

FIG. 1(b) shows a possible format for coded pulse data in a television data line. As mentioned above, the binary bits representing the coded pulse data are divided up into eight-bit bytes 1,2 . . . 20 . . . . The first two bytes 1 and 2 comprise a sequence of clock run-in pulses which in the present example consist of a sequence of alternating bits 10101010/10101010. The third byte 3 comprises a framing or start code, e.g. 11100100, which a television receiver apparatus has to identify before it will respond to accept the message information which is contained in the remaining eight-bit bytes 4,5 . . . 20 . . .

Figure 1C:
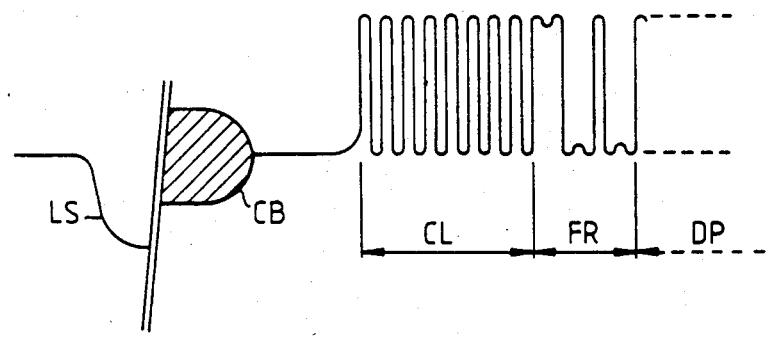

FIG. 1(c) shows in idealized form the first part of a video signal waveform for a television data line showing the sequence of clock run-in pulses CL and the sequence of pulses which comprise the framing code FR. The first few coded data pulses which represent alpha-numeric characters or other message information are shown at DP. The line synchronising pulse is represented at LS and the colour burst at CB.

Figure 2:
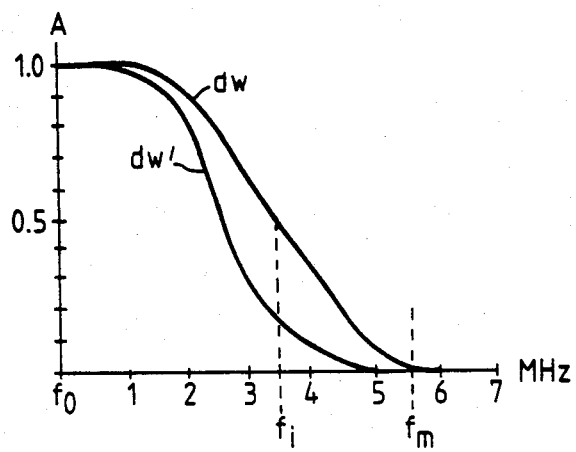
FIG. 2 illustrates the deleterious effect of echo on a data pulse spectrum.

The waveform diagram shown in FIG. 2 illustrates the deleterious effect of echo on a data pulse spectrum.

The diagram shows a relative amplitude (A)/frequency(MHz) graph of a transmitted data pulse spectrum dw over the frequency range $f_o$ to $f_m$. The effect of a close positive echo on this spectrum dw is illustrated by the received data pulse spectrum dw', from which it can be seen that the relative amplitude decreases markedly at the higher frequencies, the relative amplitude in this received data pulse spectrum becoming unacceptably low from, say, an intermediate frequency $f_i$.

In the BBC/IBA teletext system, the frequency range $f_i$ to $f_m$ is the higher frequency range of approximately 3.5 MHz to 5.5 MHz on which a circuit arrangement according to the invention would be designed to act, to improve the shape of the Teletext data pulse waveform prior to data slicing.

Figure 3:
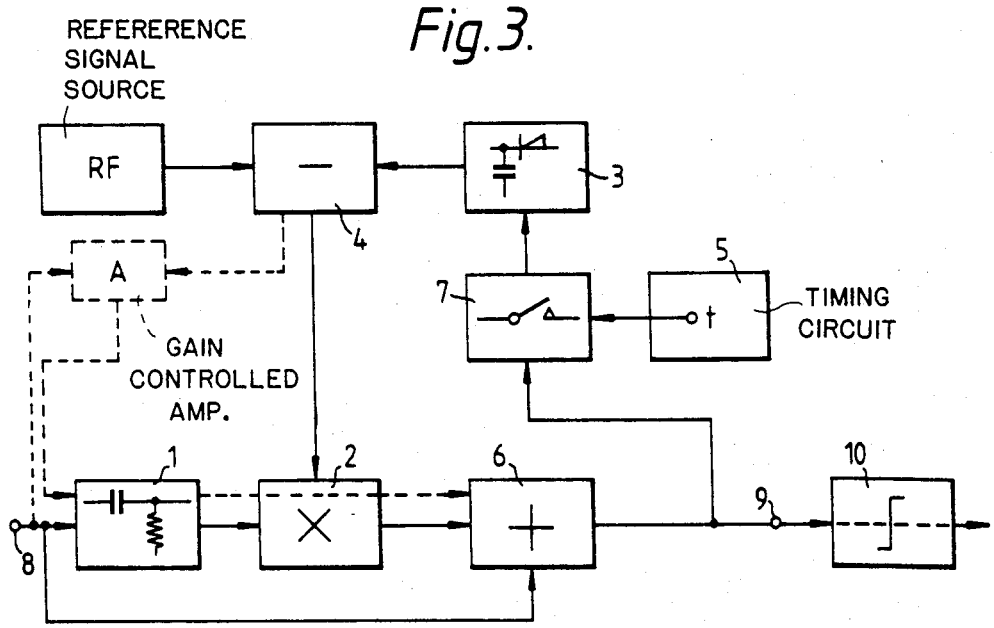
FIG. 3 is a block diagram of a circuit arrangement according to the invention.

The circuit arrangement shown in block diagram form in FIG. 3 is suitable at least partially correcting for a reduction of the amplitude of high frequency components of a data pulse waveform. The circuit arrangement comprises a high-pass filter 1, a multiplier 2, a peak-to-peak detector 3, a difference circuit 4, a timing circuit 5, a combining circuit 6 and a switch 7. A data pulse waveform is applied via a conventional gain control stage (not shown) to an input terminal 8, it being assumed that this waveform is a television video signal as represented by the waveform diagram in FIG. 1(c) previously referred to. The applied data pulse waveform is passed directly to one input of the combining circuit 6. The applied data pulse waveform is also fed to the high-pass filter 1 which is responsive to pass to the multiplier 2 only those high frequency components of the waveform which might be expected to have suffered a reduction in amplitude, compared with the remainder of the waveform, due to a close positive echo, or perhaps receiver mis-tuning. The filter 1 can be a resistance-capacitive filter of a conventional known type.

The multiplier 2, which is a four quadrant multiplier of known type, produces, as an amplitude corrected auxiliary waveform, the product of the filter output and an amplitude correcting signal which is supplied by the difference circuit 4. This amplitude corrected auxiliary waveform is applied to a second input of the combining circuit 6, in which it is added to the applied data pulse waveform to produce a "crispened" resultant waveform of improved shape. The resultant pulse waveform is passed from the output of the combining circuit 6 to an output terminal 9 for application to a data slicer 10 of a data acquisition circuit (not otherwise shown), in which the circuit arrangement would be embodied for the use being assumed for which the applied data pulse waveform is a television video signal.

The resultant pulse waveform is also applied to the switch 7 which is operated by the timing circuit 5 so as to be closed for the period during which the sequence of clock pulses (CL) of the television video signal occurs. Thus, during this period the resultant pulse waveform is fed via the switch 7 to the detector 3 which is responsive to provide a control signal which is proportional to the mean peak-to-peak amplitude of the resultant pulse waveform during this period. This control signal is applied to the difference circuit 4 to which is also applied a reference signal from a source RF. The difference circuit 4 is responsive to the control signal and the reference signal to produce a difference signal which constitutes the amplitude correcting signal applied to the multiplier 2. Thus, the high frequency components of the applied data pulse waveform, as passed by the filter 1, are adjusted in amplitude, in proportion to the mean peak-to-peak amplitude of the resultant pulse waveform during the period that the sequence of clock pulses (CL) occurs, to form the amplitude corrected auxiliary waveform.

Figure 4:
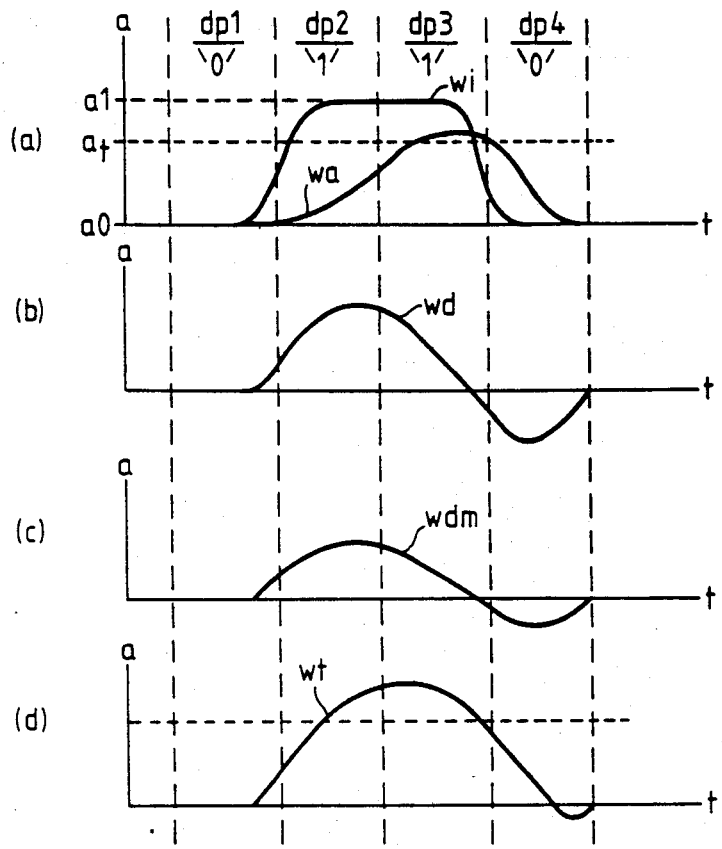
FIGS. 4(a) to 4(d) show explanatory waveform diagrams relating to the method of "crispening" according to the present invention as performed by the circuit arrangement of FIG. 3.

The waveform diagramms shown in FIGS. 4(a) to 4(d) illustrate on graphs of amplitude (a) against time (t), the "crispening" effect of the circuit arrangement of FIG. 3 on a data pulse waveform applied to the input terminal 8. In FIG. 4(a), the waveform wi represents an idealized shape for the applied waveform over four data bit periods dp1 to dp4. In the data bit periods dp1 and dp4 the waveform wi has a substantially zero amplitude a0 which corresponds to the binary '0' level, and in the data bit periods dp2 and dp3 the waveform wi has an amplitude a1 which corresponds to the binary '1' level. An actual shape for the applied waveform is represented by the waveform wa which exemplifies the effects of distortion, due to a close positive echo or due to receiver mis-tuning, on the idealized waveform wi. It can be seen that in the data bit period dp3, the waveform wa still has a portion thereof which exceeds a threshold amplitude $a_t$ above which a binary '1' level is detected, so that the binary level '1' can still be correctly detected from this waveform in the period dp3. However, the waveform wa is below the threshold amplitude $a_t$ for the whole of the data bit period dp2, so that the binary level '0' would now be erroneously detected from this waveform in the period dp2. Also the waveform wa has suffered distortion such that the binary level '1' will be erroneously detected in the data bit period dp4 instead of the correct binary level '0'. Therefore, if the waveform wa were to be applied directly to the data slicer 10, then erroneous data bit regeneration would occur.

The waveform wd shown in FIG. 4(b) represents the waveform produced by the differentiating action of the high-pass filter 1 and the waveform wdm shown in FIG. 4(c) represents the amplitude corrected auxiliary waveform which is produced at the output of the multiplier 2. The waveform wt shown in FIG. 4(d), which is obtained by summing the instantaneous amplitudes of the waveforms wa and wdm (as affected by the combining circuit 6), represents the resultant pulse waveform which is produced by the circuit arrangement. Comparison of this waveform wt with the original idealized waveform wi shows that the waveform wt has the correct binary levels in all four of the data bit periods dp1 to dp4, because the "crispening" which has occured has altered the actual position in time of the originally applied (distorted) data pulse waveform wa, as well as increased the slope of its leading and trailing flanks.

Conveniently, it is arranged that the reference signal from the source RF has a value which provides an amplitude correcting signal that produces a maximum amplitude of the waveform wdm in the absence of the control signal from the detector 3 and a minimum amplitude of the waveform wdm when the control signal has a maximum value. Thus, as the control signal decreases, say, in value (as the mean amplitude of the resultant pulse waveform decreases) then the amplitude correcting signal increases correspondingly in value to tend to increase the amplitude of the waveform wdm until equilibrium is reached to maintain the control signal steady at a value determined by the mean peak-to-peak amplitude of the sequence of clock run-in pulses.

By limiting the adaptive control of the "crispening" action performed by the circuit arrangement to the clock run-in period of each television data line, there is avoided the problem of a large drift occurring in the control signal level whenever the applied data pulse waveform consists of a long sequence of '0' or '1' data pulses for which no viable auxiliary waveform would be produced. It is during the clock run-in period of each television data line that the high frequency components in the applied data pulse waveform can be readily detected.

Figure 5:
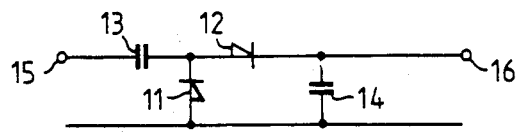
FIGS. 5 and 6 show respective circuit elements for the circuit arrangement of FIG. 3.

As regards the implementation of the circuit arrangement of FIG. 3, in addition to the filter 1 and multiplier 2 which, as aforesaid, can be of known type, the difference circuit 4 and the combining circuit 6 can be a subtractor and an adder of known type, respectively. The switch 7 would be an electronic switch also of known type. The detector 3 can take the general form shown in FIG. 5, wherein the circuit comprises two diodes 11 and 12 and two capacitors 13 and 14. An alternating signal applied to an input terminal 15 is fed via capacitor 13 to the two diodes 11 and 12 of which, diode 12 conducts on the positive half cycles to store the positive peak value of the alternating signal on the capacitor 14, and diode 11 conducts on the negative half cycles to produce the amplitude of the negative peak of the alternating signal at the return side of the capacitor 14. A discharge path for this capacitor 14 can be provided by a high value shunt resistor (not shown) or this capacitor 14 can be a "leaky" capacitor. The resulting control signal appears at an output terminal 16. With the data pulse waveform in the form of a bi-level television video signal as shown in FIG. 1(c) being assumed for the present purposes, it will of course be apparent that the above reference to an alternating signal applied to input terminal 15 is to be construed in a relative sense as regards the polarities of its peak values.

Figure 6:
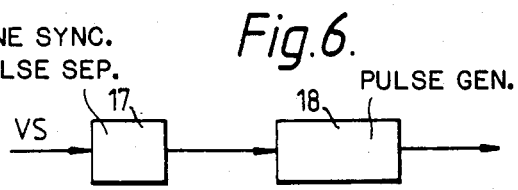

The timing circuit 5 can take the form shown in FIG. 6, wherein it comprises a line synchronizing pulse separator 17 and a pulse generator 18. The sync. separator 17 detects the line sync. pulses such as LS1 and LS2 (FIG. 1(a)) in a received video signal VS to trigger the pulse generator 18 which is responsive to produce the timing pulse t by which the switch 7 is operated. The pulse generator 18 includes a trigger delay such that the timing pulse t occurs at the beginning of the sequence of clock pulses CL (FIG. 1(c)) and lasts for substantially the duration thereof. The tolerances in the timing of the coded pulse data along the television data line have to be taken into account when determining the trigger delay for the pulse generator 18.

As a possible modification to the circuit arrangement of FIG. 3, the amplitude correction control on the auxiliary waveform to be combined with the applied data pulse waveform, can be carried out on the applied data pulse waveform itself before the differentiating action by the filter 1. For this purpose, an ordinary gain controlled amplifier A would be inserted between the input terminal 8 and the filter 1, this amplifier being controlled by the amplitude correcting signal from the difference circuit 4. The multiplier 2 is then dispensed with. This possible modification is shown in dotted lines in FIG. 3. Because the applied data pulse waveform is always of one polarity only between maximum and minimum values, it is now not necessary to use a four-quadrant multiplier as the gain controlled amplifier. The multiplier 2 is used in the original circuit nature because of the alternating signal output from the filter 1 and because it affords the option of having an amplitude correcting signal which has a range extending between opposite polarities. However, if this option is not required then an ordinary gain controlled amplifier can also be used instead in the original circuit.

I claim:

1. A circuit arrangement for improving the shape of a data pulse waveform which is composed of data pulses that occur in a serial bit stream and are arranged in successive bursts of which each comprises a sequence of clock run-in pulses followed by a sequence of code pulses; which circuit arrangement comprises a high-pass filter for receiving said data pulse waveform and operable as a differentiator to separate high frequency components of that waveform from the remainder thereof, these separated high frequency components forming an auxiliary waveform, and a combining circuit coupled to said high-pass filter for receiving said auxiliary waveform as well as said data pulse waveform and operable to produce as an output of said circuit arrangement a resultant pulse waveform; characterized in that said circuit arrangement further comprises control means coupled to the output of said combining circuit to receive the resultant pulse waveform and for producing an amplitude correcting signal which, for each data pulse burst, is adjusted to a value which is a function of the mean peak-to-peak amplitude of the sequence of clock run-in pulses in the data pulse burst, and gain control means responsive to said amplitude correcting signal for adjusting the amplitude of said auxiliary waveform for the following sequence of code pulses in the data pulse burst.

2. A circuit arrangement as claimed in claim 1, characterized in that said control means comprises reference means for producing a reference signal, a switch to which said resultant pulse waveform is applied, a timing circuit for causing said switch to close for the duration of the sequence of clock run-in pulses in each data pulse burst, a peak-to-peak detector which is connected to the switch output and includes the capacitor means for storing the mean peak-to-peak value of the sequence of clock run-in pulses, the charge on the capacitor means providing a control signal, and a difference circuit connected to receive said reference signal and said control signal and responsive thereto to produce a difference signal which constitutes said amplitude correcting signal.

3. A circuit arrangement as claimed in claim 1, characterized in that said gain control means is a four quadrant multiplier which is connected to receive the auxiliary waveform from the filter and the amplitude correcting signal, said multiplier providing the amplitude corrected auxiliary waveform at its output.

4. A circuit arrangement as claimed in claim 1 characterized in that said gain control means is a gain controlled amplifier which is connected to receive said amplitude correcting signal and through which the original pulse waveform is applied to the high-pass filter, the auxiliary waveform from the high-pass filter then constituting the amplitude corrected auxiliary waveform.

5. A circuit arrangement as claimed in claim 2, characterized in that said gain control means is a four quadrant multiplier which is connected to receive the auxiliary waveform from the filter and the amplitude correcting signal, said multiplier providing the amplitude corrected auxiliary waveform at its output.

6. A circuit arrangement as claimed in claim 2, characterized in that said gain control means is a gain controlled amplifier which is connected to receive said amplitude correcting signal and through which the original pulse waveform is applied to the high-pass filter, the auxiliary waveform from the high-pass filter then constituting the amplitude corrected auxiliary waveform.

* * * * *